US008856718B1

(12) United States Patent
Zhao

(10) Patent No.: US 8,856,718 B1
(45) Date of Patent: Oct. 7, 2014

(54) CONGESTION ESTIMATION BASED ON ROUTING RESOURCES OF PROGRAMMABLE LOGIC DEVICES

(75) Inventor: Jun Zhao, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 1011 days.

(21) Appl. No.: 12/337,502

(22) Filed: Dec. 17, 2008

(51) Int. Cl.
*G06F 17/50* (2006.01)
*H03K 19/177* (2006.01)
*H05K 3/00* (2006.01)

(52) U.S. Cl.
CPC ........ *G06F 17/5077* (2013.01); *G06F 17/5054* (2013.01); *H03K 19/17736* (2013.01); *G06F 17/5068* (2013.01); *H05K 3/0005* (2013.01); *G06F 17/5072* (2013.01)
USPC ............ 716/128; 716/126; 716/137; 716/121

(58) Field of Classification Search
CPC ............ G06F 17/5077; G06F 17/5054; G06F 17/5068; G06F 17/5072; H03K 19/17736; H05K 3/0005
See application file for complete search history.

(56) References Cited

U.S. PATENT DOCUMENTS

| | | | |
|---|---|---|---|
| 5,648,913 | A | 7/1997 | Bennett et al. |
| 5,659,484 | A | 8/1997 | Bennett et al. |
| 6,675,364 | B1 * | 1/2004 | Basto et al. .................. 716/108 |
| 6,813,754 | B2 | 11/2004 | Wu et al. |
| 7,143,378 | B1 | 11/2006 | Nag |
| 7,146,590 | B1 * | 12/2006 | Chaudhary ................... 716/113 |
| 7,275,230 | B2 * | 9/2007 | Gentry et al. ................. 716/139 |
| 7,289,946 | B1 * | 10/2007 | Lee ................................. 703/16 |
| 7,681,165 | B2 * | 3/2010 | Peters et al. .................. 716/119 |
| 7,853,912 | B2 * | 12/2010 | Binder et al. ................. 716/113 |
| 7,962,886 | B1 * | 6/2011 | Pandey et al. ................ 716/136 |
| 7,992,120 | B1 * | 8/2011 | Wang et al. ................... 716/128 |
| 8,069,431 | B1 * | 11/2011 | Zhang ........................... 716/128 |
| 8,112,731 | B1 * | 2/2012 | Shen et al. .................... 716/116 |
| 2009/0113373 | A1 * | 4/2009 | Fukuda .......................... 716/13 |

OTHER PUBLICATIONS

P. Kannan et al., "On Metrics for Comparing Routability Estimation Methods for FPGAs", Proc. IEEE/ACM Int'l Conf. on Computer-Aided Design; pp. 70-75, New Orleans, Louisiana, Jun. 2002.

P. Kannan et al., "fGREP—Fast Generic Routing Demand Estimation for Placed FPGA Circuits", 11th Int'l Workshop on Field-Programmable Logic and Applications, FPL. Springer-Verlag, Berlin, Aug. 2001.

C.-L.E. Chang et al., "RISA: Accurate and Efficient Placement Routability Modeling", Proc. of ICCAD, 1994.

(Continued)

*Primary Examiner* — A. M. Thompson

(57) ABSTRACT

A computer-implemented method of estimating signal congestion in routing resources of a programmable logic device (PLD), wherein the routing resources include configurable interface blocks (CIBs) and wires of different types supported by the CIBs. The method includes identifying, from a representation of a PLD stored within a computer system, components of the PLD to be connected in a configuration of the PLD. A CIB associated with an identified PLD component is then selected. A wire type supported by the selected CIB is also selected. The number of wires of the selected type needed at the selected CIB to implement the PLD configuration and the number of wires of the selected type provided by the CIB are calculated. Signal congestion at the selected CIB is estimated from at least the needed number of wires and the provided number of wires.

20 Claims, 10 Drawing Sheets

(56) References Cited

OTHER PUBLICATIONS

J. Lou et al., "Estimating Routing Congestion Using Probabilistic Analysis", Proc. ACM/IEEE Intl. Symp. on Physical Design, pp. 112-117, 2001.

G. Parthasarathy et al., "Interconnect Complexity-aware FPGA Placement Using Rent's Rule", Proc. Int'l Workshop on System level Interconnect Prediction (SLIP), Apr. 2001.

A. B. Kahng et al., "Accurate Pseudo-Constructive Wirelength and Congestion Estimation", International Workshop on SLIP, pp. 61-68, Monterey, California, Apr. 2003.

Cheng et al., "A Fast Congestion Estimator for Routing with Bounded Detours," asp-dac, Asia and South Pacific Design Automation Conference 2004 (ASP-DAC'04), pp. 666-670, 2004.

J. Westra et al., "Probabilistic Congestion Prediction", Proc. ACM/IEEE Intl. Symp. on Physical Design, pp. 204-209, 2004.

M. Saeedi et al., "Predication and Reduction of Routing Congestion", Proc. ACM/IEEE Intl. Symp. on Physical Design, pp. 72-77, Apr. 2006.

D. Yeager et al., "Congestion Estimation and Localization in FPGAs: A Visual Tool for Interconnect Prediction", International Workshop on SLIP, pp. 33-39, Austin, Texas, Mar. 2007.

N. W. Eum et al., "A Router for Symmetrical FPGAs Based on Exact Routing Density Evaluation", Proc. IEEE/ACM Int'l Conf. on Computer-Aided Design, pp. 137-143, San Jose, California, 2001.

Zhuo et al., New Timing and Routability Driven Placement Algorithms for FPGA Synthesis, ACM, pp. 570-575, 2007.

Cong et al., Large-Scale Circuit Placement: Gap and Promise, Proceedings of the International Conference on Computer Aided Design (ICCAD'03), ACM, pp. 883-890, 2003.

Kong, Tim, A Novel Net Weighting Algorithm for Timing-Driven Placement, IEEE, pp. 172-176, 2002.

Ren et al., Sensitivity Guided Net Weighting for Placement Driven Synthesis, ACM, pp. 10-17, 2004.

* cited by examiner

US 8,856,718 B1

CONGESTION ESTIMATION BASED ON ROUTING RESOURCES OF PROGRAMMABLE LOGIC DEVICES

TECHNICAL FIELD

The present invention relates generally to programmable logic devices and, more particularly for example, to estimating congestion in programmable logic devices.

BACKGROUND

Programmable logic devices (PLDs), such as field programmable gate arrays (FPGAs) or complex programmable logic devices (CPLDs), may be configured to provide user-defined features. PLDs typically include various components, such as programmable logic cells, memory cells, digital signal processing cells, input/output cells, and other components. The PLD components may be interconnected through signal paths provided by routing wires of the PLD to implement a desired circuit design.

However, PLDs typically have a limited supply of routing wires available to interconnect components from different portions of the PLD. This differs from conventional application-specific integrated circuits (ASICs) in which empty physical spaces may be reserved to implement additional signal paths at a later time if desired. Thus, if a given circuit design requires too many signals to be interconnected between certain regions of a PLD, the limited number of available wires may become nearly or completely exhausted, leading to congestion in the PLD signal paths.

Existing approaches to determining PLD congestion are normally based on simplified representations of PLD routing wires. For example, in one approach, a PLD may be represented as having routing wires of uniform length. In another approach, a PLD may be represented as having equal numbers of routing wires with different lengths.

Unfortunately, such simplified representations typically do not account for actual PLD implementations which may include different numbers of routing wires having different lengths. As a result, signal congestion estimates obtained using such representations may differ substantially from the actual signal congestion exhibited by a PLD. Accordingly, there is a need for an improved approach to estimating signal congestion in PLDs.

SUMMARY

According to one embodiment of the invention, a. computer-implemented method of estimating signal congestion in routing resources of a programmable logic device (PLD) is disclosed, wherein the routing resources comprise configurable interface blocks (CIBs) and wires of different types supported by the CIBs. The method includes: identifying, from a representation of a PLD stored within a computer system, components of the PLD to be connected in a configuration of the PLD; selecting, within the computer system, a CIB associated with an identified PLD component; selecting, within the computer system, a wire type supported by the selected CIB; calculating, within the computer system, the number of wires of the selected type needed at the selected CIB to implement the PLD configuration and the number of wires of the selected type provided by the CIB; and estimating, within the computer system, signal congestion at the selected CIB from at least the needed number of wires and the provided number of wires.

According to another embodiment of the invention, a computer readable storage medium that stores computer readable instructions for performing the method described above is disclosed.

According to another embodiment of the invention, a system including one or more processors and one or more memories that store computer readable instructions for performing the method described above is disclosed.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various techniques described herein, signal congestion can be estimated for routing resources used to selectively interconnect PLD components. In one embodiment, the routing resources may include wires of various lengths, interface blocks (also referred to as common interface blocks), and connections within the interface blocks. In one embodiment, the wires and connections within the interface blocks are generally referred to as connections.

The interface blocks may be implemented to support different types of connections. In one embodiment, a connection type may correspond to a wire of a particular length which may be connected to one or more interface blocks. In another embodiment, a connection type may correspond to an internal connection of an interface block (e.g., located within the interface block). For example, each interface block may be implemented to support a first number of connections to wires of a first length, a second number of connections to wires of a second length, and a third number of connections within the interface block. Signal congestion at each interface block may be estimated for different types of connections (e.g., wires of various lengths and connections within the interface block) based on the number of connections made at the interface block for each type of connection. By determining such signal congestion for a plurality of interface blocks distributed throughout a PLD, areas of signal congestion in the PLD may be determined for different types of connections.

As further described herein, various numeric values may be determined (e.g., calculated) to support the signal congestion estimate. For example, the signal congestion estimate may include determining a total number of connections of a particular type needed at the interface block for a desired PLD configuration. The signal congestion estimate may also include determining a total number of connections of a particular type that are provided by the interface block. The signal congestion estimate may take the form of a congestion index value that is determined for each type of routing resource at each interface block based on a ratio of the number of connections needed at the interface block to the number of connections provided by the interface block.

In one embodiment, the congestion index value may be limited to a maximum value of one. That is, if the ratio of the connections identified above is greater than one, then the congestion index value may be assigned to have a value of one. An overflow connection value (i.e., a number of overflow connections) may be determined for each type of routing resource at each interface block based on the difference between the number of connections needed at the interface block and the number of connections actually provided by the interface block.

Figure 1:
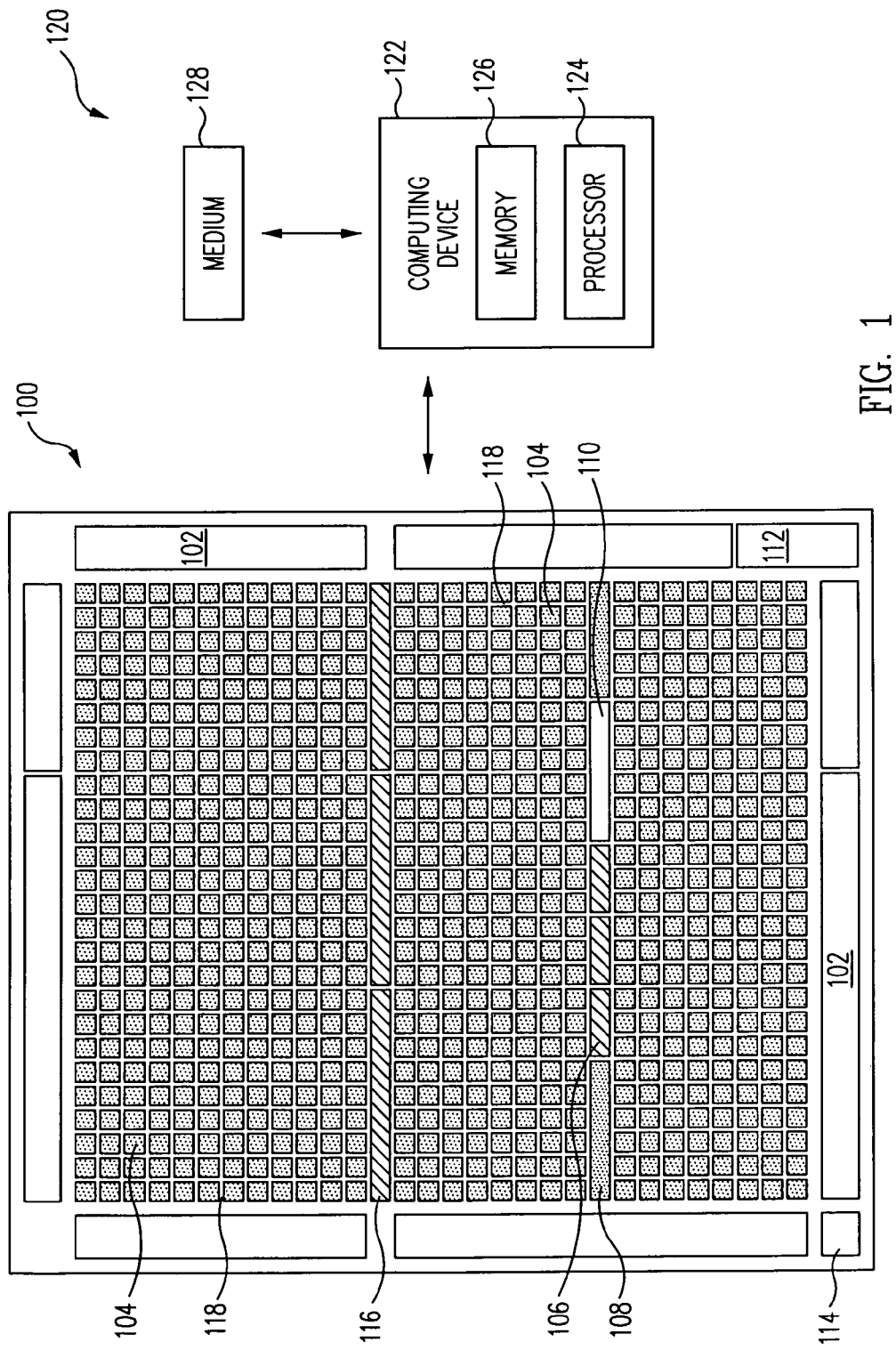
FIG. 1 illustrates a block diagram of a programmable logic device (PLD) and a system for generating configuration data for use with the PLD in accordance with an embodiment of the invention.

FIG. 1 illustrates a block diagram of a programmable logic device (PLD) 100 and a system 120 for generating configuration data for use with PLD 100 in accordance with an embodiment of the invention. In one embodiment, PLD 100 may be implemented as a PLD in the ECP2/M family of devices available from Lattice Semiconductor Corporation of Hillsboro, Oreg.

PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

System 120 includes a computing device 122 and a computer readable medium 128. As shown, computing device 122 includes a processor 124 and a memory 126. Processor 124 may be configured with appropriate software (e.g., a computer program for execution by a computer) that is stored on computer readable medium 128 and/or in memory 126 to instruct processor 124 to perform one or more of the operations described herein. In one embodiment, such software may be available from Lattice Semiconductor Corporation of Hillsboro, Oreg.

In one embodiment, means such as processor 124 configured with such software may be used for estimating signal congestion in routing resources of PLD 100 (wherein the routing resources comprise a plurality of interface blocks and a plurality of connections of different types supported by the interface blocks) by identifying a plurality of components of the PLD to be connected in a configuration of the PLD, selecting one of the interface blocks, selecting one of the connection types supported by the selected interface block, determining a number of connections of the selected connection type needed at the selected interface block to implement the PLD configuration and a number of connections of the selected type provided by the selected interface block; and estimating signal congestion at the selected interface block with the needed number and provided number of connections.

Processor 124 and memory 126 may be implemented in accordance with any appropriate components that may be used to provide computing system 120. Similarly, computer readable medium 128 may be implemented using any appropriate type of machine-readable medium used to store software. System 120 may be implemented to provide configuration data prepared by system 120 to PLD 100 through, for example, configuration port 112.

Figure 2:
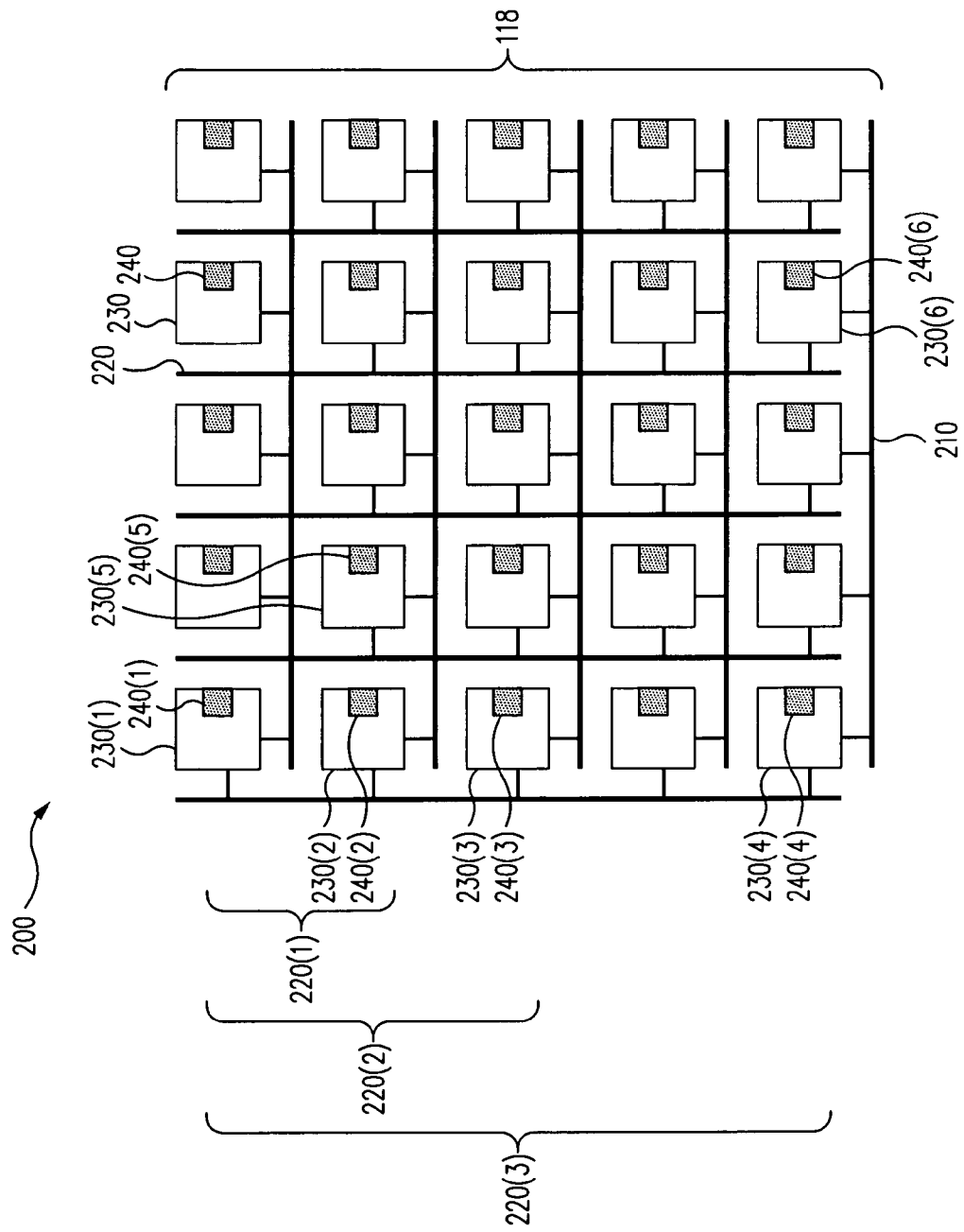
FIG. 2 illustrates a set of routing resources used to interconnect components of a PLD in accordance with an embodiment of the present invention.

FIG. 2 illustrates a set 200 of routing resources 118 used to interconnect components of PLD 100 in accordance with an embodiment of the present invention. Routing resources 118 include a plurality of horizontal wires 210, a plurality of vertical wires 220, and a plurality of common interface blocks (CIBs) 230 which may be used to selectively interconnect a plurality of components 240. In this regard, components 240 may be, for example, logic blocks 104 or other components of PLD 100 previously identified herein. CIBs 230 provide input/output connections between wires 210/220 and components 240 as further described herein.

In the embodiment shown in FIG. 2, components 240 are substantially equally spaced and arranged in a grid having a length of five horizontal positions and five vertical positions. However, in other embodiments, any desired number of horizontal and vertical positions may be used.

Wires 210/220 of different lengths may be used to selectively connect various components 240 depending on the proximity of such components 240 and the availability of wires 210/220 of desired lengths. For example, as shown in FIG. 2, components 240(1) and 240(2) are located in adjacent positions in the grid. As such, a vertical wire 220(1) having a length of one or more grid positions may be used to connect components 240(1) and 240(2) through CIBs 230(1) and 230(2).

As another example, components 240(1) and 240(3) are separated by a distance of two grid positions. As such, a vertical wire 220(2) having a length of two or more grid positions may be used to connect components 240(1) and 240(3) through CIBs 230(1) and 230(3). In one embodiment, vertical wire 220(2) may be implemented as a single wire having a length of two or more grid positions. In another embodiment, vertical wire 220(2) may be implemented by a plurality of shorter wires that have been interconnected to provide a combined length of two or more grid positions.

As a further example, components 240(1) and 240(4) are separated by a distance of four grid positions. As such, a vertical wire 220(3) having a length of four or more grid positions may be used to connect components 240(1) and 240(4) through CIBs 230(1) and 230(4). In one embodiment, vertical wire 220(3) may be implemented as a single wire having a length of four or more grid positions. In another embodiment, vertical wire 220(3) may be implemented by a plurality of shorter wires that have been interconnected to provide a combined length of four or more grid positions.

Although the above examples are described in terms of vertical wires 220, similar or different wire lengths may be used to provide horizontal connections, or combined horizontal and vertical connections, as desired. In this regard, various horizontal wires 210 and vertical wires 220 may be interconnected with each other to connect, for example, components 240(5) and 240(6) through CIBs 230(5) and 230(6) located in different columns and rows of the grid.

Figure 3:
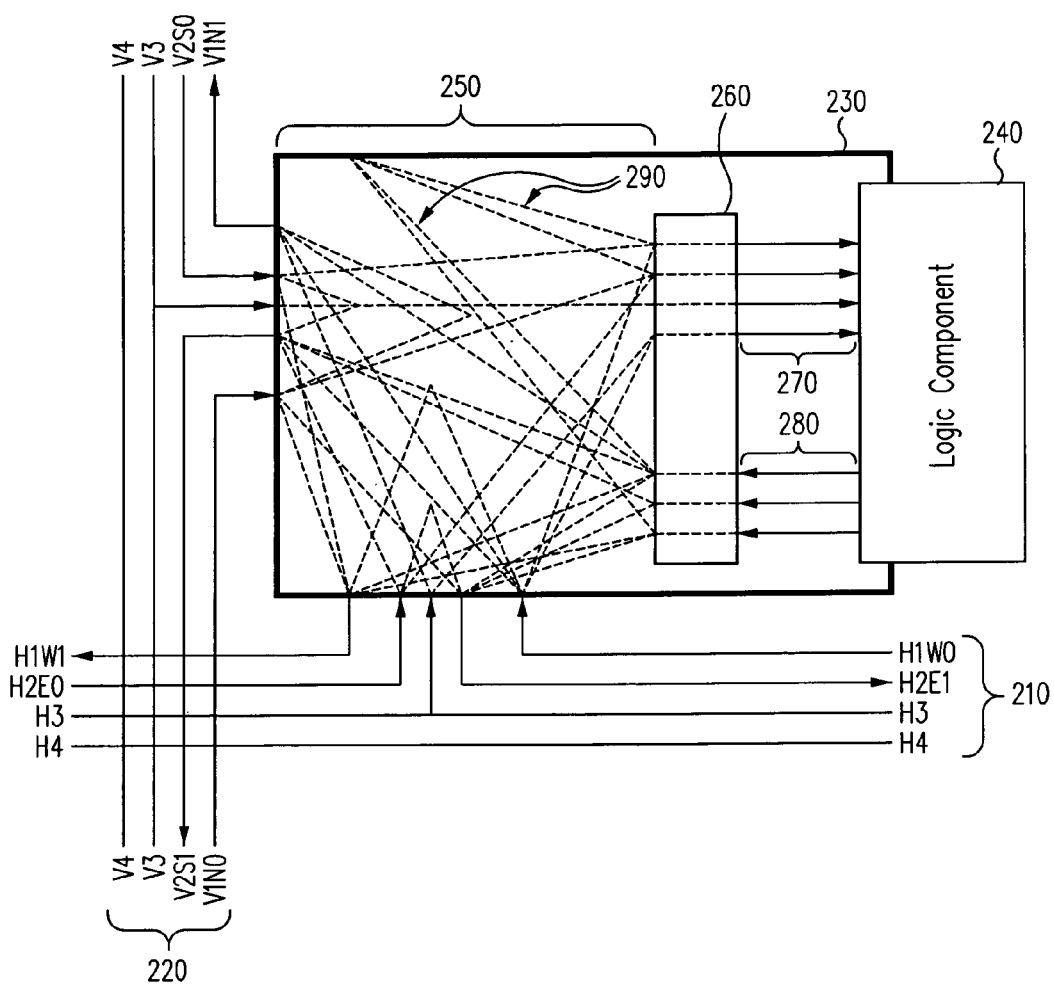
FIG. 3 illustrates a common interface block of a PLD in accordance with an embodiment of the present invention.

FIG. 3 illustrates one of CIBs 230 in accordance with an embodiment of the present invention. CIB 230 includes a switch box 260 which may be used to route a plurality of input connections 270 and a plurality of output connections 280 to and from one of components 240.

CIB 230 also includes a plurality of connections 250 which may be used to interconnect wires 210/220, switch box 260, and connections 270/280 as desired. In one embodiment, the routing of connections 250 shown in FIG. 3 may be implemented by multiplexers of CIB 230.

As shown in FIG. 3, a plurality of connections 290 are included in connections 250 and are used to interconnect inputs and outputs of switch box 260 as shown in FIG. 3. As such, it will be appreciated that connections 290 do not traverse to other CIBs 230 (e.g., do not traverse to other grid positions as described above). Accordingly, connections 290 are referred to herein as X0 connections having a length of zero grid positions. In another embodiment, connections 290 may be implemented by X2 connections further described herein.

Figure 4:
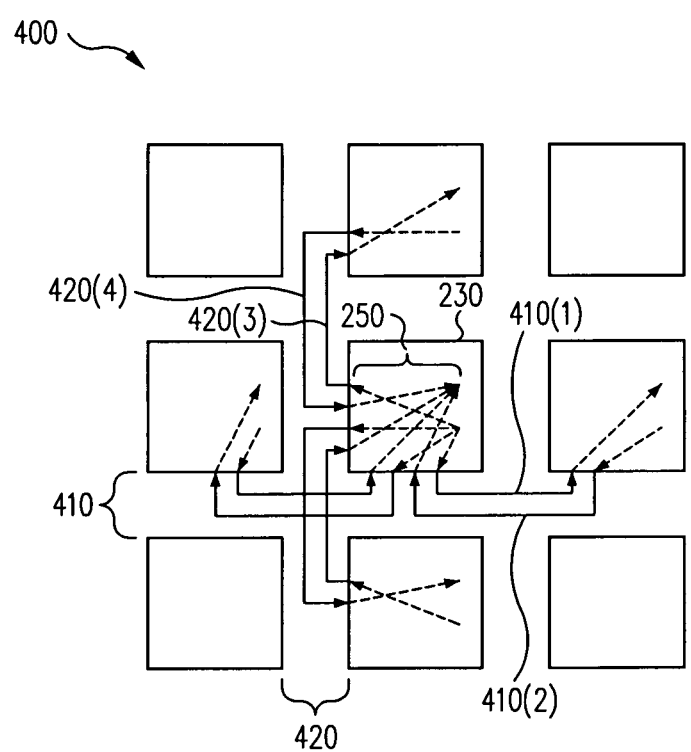
FIGS. 4-6 illustrate sets of routing resources including wires of various lengths used to interconnect components of a PLD in accordance with embodiments of the present invention.
Figure 5:
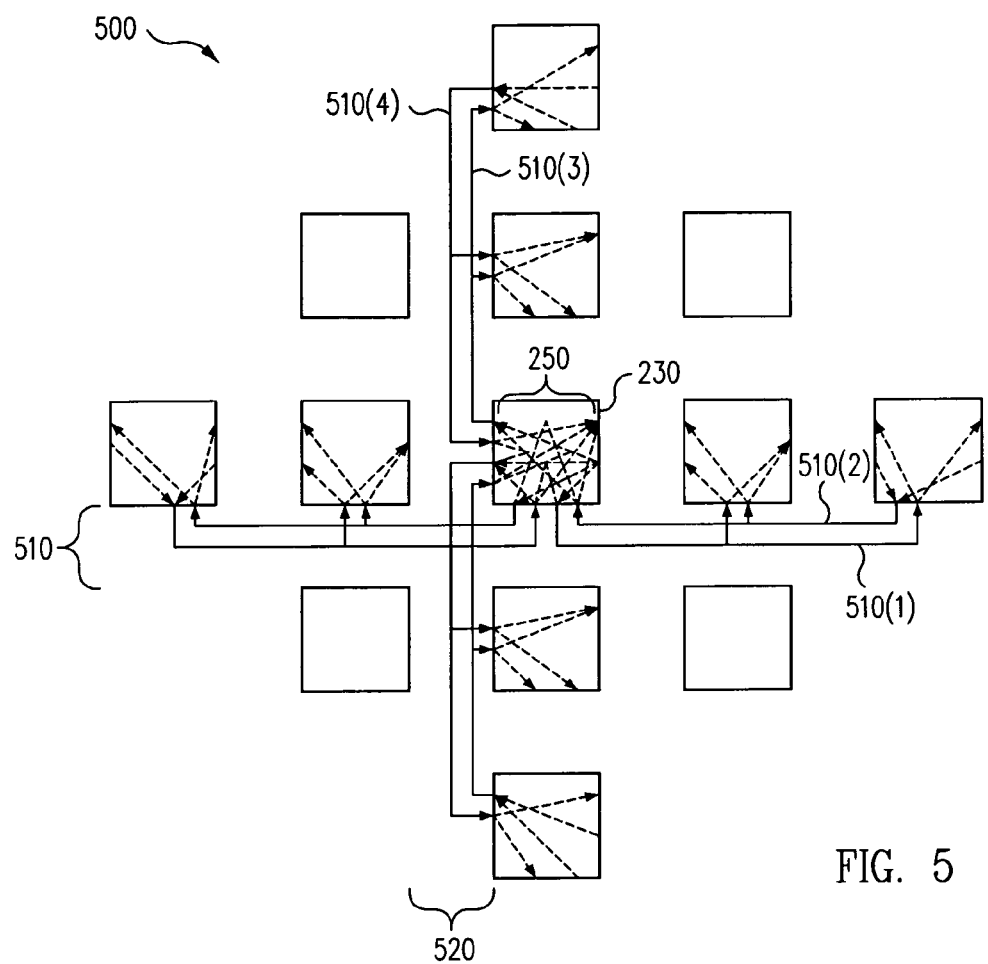
Figure 6:
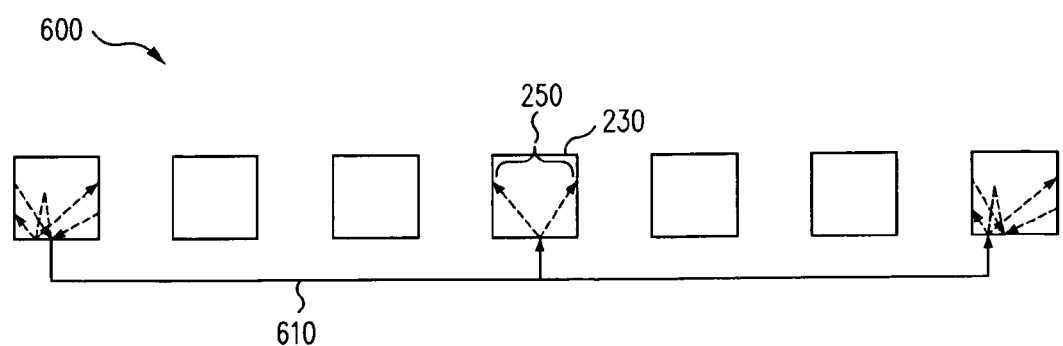

FIGS. 4, 5, and 6 illustrate sets of routing resources 118 including wires having lengths of 1, 2, and 6 grid positions, respectively, used to interconnect components 240 of PLD 100 in accordance with embodiments of the present invention.

In FIG. 4, a set 400 of CIBs 230 are connected by a plurality of horizontal wires 410 and a plurality of vertical wires 420. CIBs 230 also include various connections 250 which may be used to connect wires 410/420 to switch boxes 260 (not shown in FIG. 4) and components 240 (not shown in FIG. 4) associated with CIBs 230. In one embodiment, wires 410/420 may be implemented by wires 210/220 previously described herein.

Each of wires 410/420 is unidirectional and spans a distance of only one grid position to connect adjacent CIBs 430. Accordingly, each of wires 410/420 is also referred to herein as an X1 connection having a length of one grid position.

In addition, wires 410/420 extend in various directions which may be identified using cartographic reference directions. In this regard, it will be appreciated that horizontal wires 410 extend in substantially east (e.g., wire 410(1)) and west (e.g., wire 410(2)) directions, and vertical wires 420 extend in substantially north (e.g., wire 420(3)) and south (e.g., wire 420(4)) directions.

In FIG. 5, a set 500 of CIBs 230 are connected by a plurality of horizontal wires 510 and a plurality of vertical wires 520. CIBs 530 also include various connections 250 which may be used to connect wires 510/520 to switch boxes 260 (not shown in FIG. 5) and components 240 (not shown in FIG. 5) associated with CIBs 230. In one embodiment, wires 510/520 may be implemented by wires 210/220 previously described herein.

Each of wires 510/520 is unidirectional and spans a distance of two grid positions. In this regard, each of wires 510/520 has a length of two grid positions and may be used to connect CIBs 530 separated by two grid positions. Accordingly, each of wires 510/520 is also referred to herein as an X2 connection having a length of two grid positions.

Also, each of wires 510/520 includes an intermediate connection (e.g., at approximately the midpoint of each wire 510/520) which may be used to connect adjacent CIBs 230. In this regard, X2 connections (e.g., wires 510/520) may be substituted for X1 connections (e.g., wires 410/420) if desired (e.g., if an insufficient number of wires 410/420 are available).

In another embodiment, X2 connections may be implemented to begin and end at a single CIB 230 (e.g., in a loop-back configuration). In such an embodiment, X2 connections may be substituted for X0 connections and/or used as overflow connections to support excess X0 connections as further described herein.

Similar to wires 410/420, it will be appreciated that horizontal wires 510 extend in substantially east (e.g., wire 510 (1)) and west (e.g., wire 510(2)) directions, and vertical wires 520 extend in substantially north (e.g., wire 520(3)) and south (e.g., wire 520(4)) directions.

In FIG. 6, a set 600 of CIBs 230 are connected by a horizontal wire 610. CIBs 230 also include various connections 250 which may be used to connect wire 610 to switch boxes 260 (not shown in FIG. 6) and components 240 (not shown in FIG. 6) associated with CIBs 230. In one embodiment, CIBs 630 may be implemented by CIBs 230, wire 610 may be implemented by wires 210, and connections 650 may be implemented by connections 350 previously described herein.

Wire 610 is unidirectional and spans a distance of six grid positions. In this regard, wire 610 has a length of six grid positions and may be used to connect CIBs 630 separated by six grid positions. Accordingly, wire 610 is also referred to herein as an X6 connection having a length of six grid positions. Also, wire 610 includes an intermediate connection (e.g., at approximately the midpoint of wire 610) which may be used to connect CIBs 630 separated by three grid positions.

Although only a single wire 610 is shown in FIG. 6 extending in a substantially east direction, additional horizontal wires 610 (not shown) and vertical wires 620 (not shown) having lengths of six grid positions may be provided which extend in substantially east, west, north, and south directions.

Routing resources 118 of PLD 100 may include any or all of the various types of X0, X1, X2, and/or X6 connections described above in relation to FIGS. 3-6. For example, horizontal wires 210 may include any desired number of horizontal wires 410, 510, and/or 610. Similarly, vertical wires 220 may include any desired number of vertical wires 420, 520, and/or 620. Also, CIBs 230 may include any desired number of connections 250.

In one embodiment, fixed numbers of X0, X1, X2, and X6 connections may be available to be connected to each of CIBs 230. In this regard, signal congestion of PLD 100 may be estimated for each type of connection made to CIBs 230. Different connection lengths (e.g., longer or shorter wires) are also contemplated.

The various connections described herein may have different characteristics which may be advantageously used for different types of signals in PLD 100. For example, X0 connections may be used to provide signal paths inside CIBs 230. X1 connections may be used to provide direct and fast connections between neighboring CIBs 230 and/or to connect to longer X2 or X6 connections. X2 connections may be used to provide connections over distances of two grid positions, connect to longer X6 connections, and/or may be chained together with other X2 connections (e.g., in a serial fashion) to provide long connections. X6 connections may be used to provide connections over long distances (e.g., typically greater than four grid positions).

Figure 7:
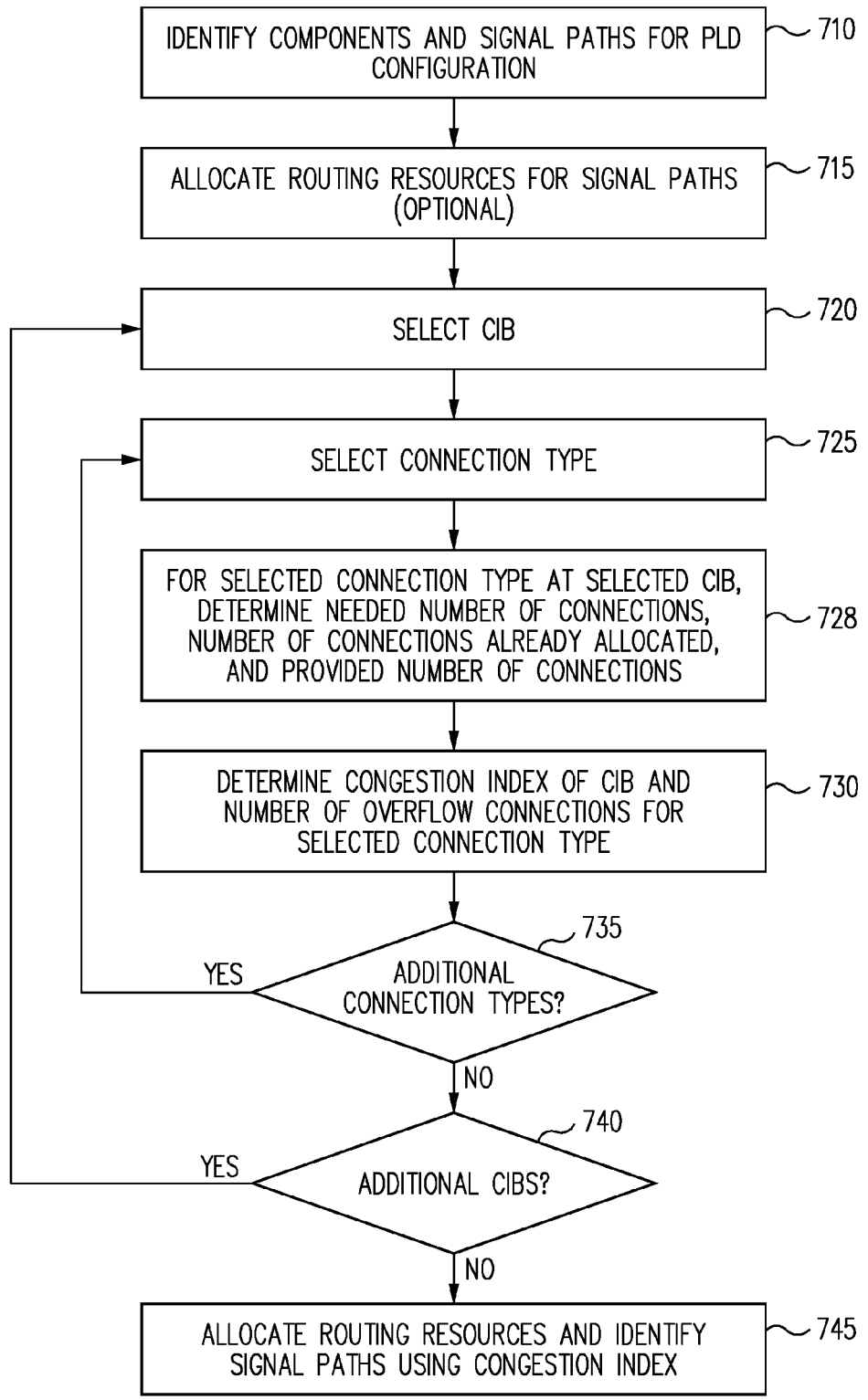
FIG. 7 illustrates a process to estimate signal congestion associated with common interface blocks of a PLD in accordance with an embodiment of the present invention.

FIG. 7 illustrates a process to estimate signal congestion associated with CIBs 230 of PLD 100 in accordance with an embodiment of the present invention. In particular, the process of FIG. 7 may be performed by system 120 to estimate signal congestion for X0, X1, X2, and X6 connections at CIBs 230.

In step 710, system 120 identifies components of PLD 100 (e.g., logic blocks 104 or other components of PLD 100) to be connected in a configuration of PLD 100. For example, in one embodiment, system 120 may store a netlist (e.g., in memory 126) which identifies various PLD components to be connected together in order to implement a desired configuration of PLD 100 (e.g., to implement desired circuits and functions in PLD 100). Also in step 710, system 120 identifies possible signal paths through routing resources 118 using X0, X1, X2, and/or X6 connections to CIBs 230.

In step 715, system 120 optionally allocates routing resources 118 to implement some or all the signal paths identified in step 710. In this regard, system 120 may allocate particular X0, X1, X2, and/or X6 connections to CIBs 230 to be used to implement the signal paths. Accordingly, it will be appreciated that after step 715 is performed, at least some of the available X0, X1, X2, or X6 connections to CIBs 230 of routing resources 118 may be used (e.g., allocated or occupied) and are thus unavailable to be used for other signal paths identified in step 715.

In another embodiment, step 715 is omitted. In this case, none of the available X0, X1, X2, or X6 connections to CIBs 230 of routing resources 118 will yet be used by signal paths and components identified in step 710. Accordingly, such connections will remain available to be allocated to implement the signal paths.

In step 720, system 120 selects one of CIBs 230 to be considered. In step 725, system 120 selects a desired type of connection to be considered (e.g., an X0, X1, X2, or X6 wire connection type) for the selected CIB 230. For example, during a first iteration of step 725, an X0 connection type may be selected.

As previously described, X1, X2, and X6 wires used to implement the different connection types may be further differentiated from each other based on their directional orientation (e.g., extending in substantially east, west, north, or south directions). Accordingly, in another embodiment, connection types may be selected based on such directional orientations in step 720. For example, rather than generally selecting X1 connection types in step 725, system 120 may select more specific X1 east, X1 west, X1 north, or X1 south connection types in step 725. As a result, congestion index values and overflow connection values may be determined for such connection types based on their directional orientation. Such values can improve the accuracy of congestion estimation determinations for CIBs 230 having such connection types. Such directional orientations may be similarly applied to X2 and X6 connection types.

In the description of FIG. 7 (and also the subsequent descriptions of FIGS. 8-9), it will be assumed that the selected connection type does not refer to a particular directional orientation. However, connection types based on such directional orientations may be used in other embodiments (for example, as set forth in the subsequent description of FIG. 10 with regard to horizontal and vertical orientations).

Figure 8:
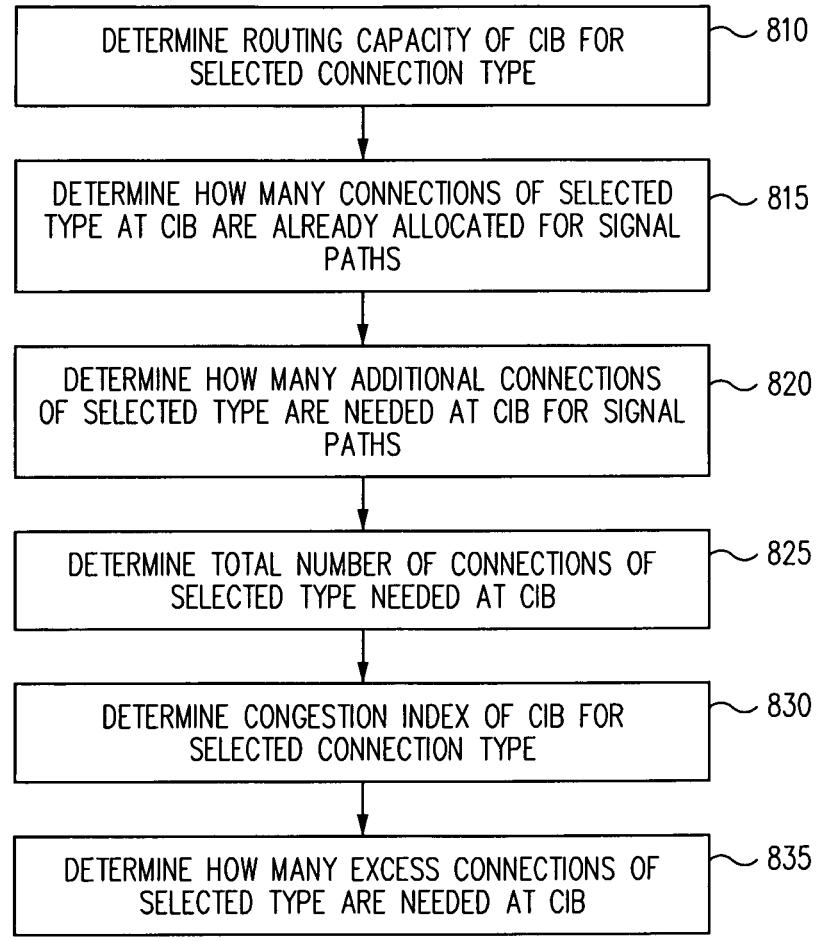
FIG. 8 illustrates a process to determine a congestion index value for a selected connection type in accordance with an embodiment of the present invention.
Figure 9:
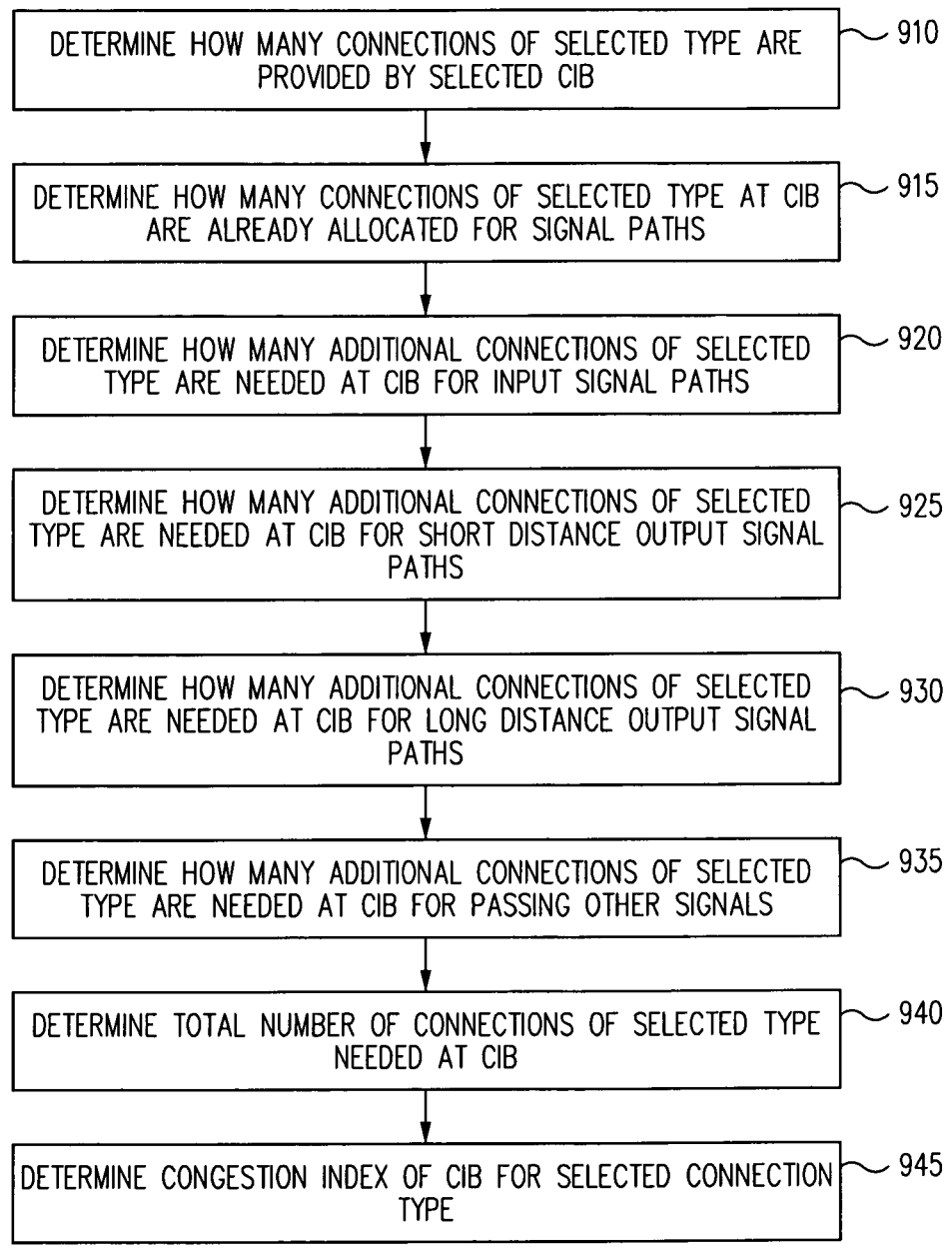
FIG. 9 illustrates another process to determine a congestion index value for a selected connection type in accordance with an embodiment of the present invention.

In steps 728 and 730, system 120 determines a congestion index value and an overflow connection value associated with the selected CIB 230 for the selected connection type in accordance with the process of FIG. 8 or the process of FIG. 9 further described herein. Briefly, in step 728, system 120 determines a number of wires of the selected wire type needed at the selected CIB to implement the PLD configuration, a number of wires of the selected wire type already allocated at the CIB, and a provided number of wires of the selected wire type provided by the CIB. In step 730, the system then determines the congestion index at the selected CIB for the selected wire type from the needed number of wires, the already allocated number of wires, and the provided number of wires.

As previously discussed, the congestion index value may correspond to a ratio of the number of connections of the selected connection type needed at the selected CIB 230 to the number of connections of the selected connection type provided by the selected CIB 230. Small values of the congestion index value (e.g., close to zero) may indicate that the selected CIB 230 is not congested and that additional signal paths using the selected connection type may be supported by the selected CIB 230. Large values of the congestion index value (e.g., close to one) may indicate that the selected CIB 230 is congested and that very few or no additional signal paths using the selected connection type may be supported by the selected CIB 230.

As also previously discussed, the overflow connection value may correspond to the difference between the number of connections needed and the number of connections provided at the selected CIB 230. Thus, if the number of connections needed exceeds the number of connections provided, then the overflow connection value will indicate how many excess connections of the selected connection type are still needed to be supported by the selected CIB 230. In certain embodiments, these excess connections may be supported by other types of connections. For example, in one embodiment, X2 connections may be used to support excess (i.e., overflow) X0 and X1 connections if desired in particular embodiments. In such an embodiment, overflow connection values are calculated only for X0 and X1 connections, which may be supported by X2 connections. The support of overflow connections will be further described herein with regard to the process of FIG. 9.

In step 735, if additional connection types of the selected CIB 230 have not yet been considered, then the process of FIG. 7 returns to step 725 wherein another connection type is selected for consideration. Continuing the example described above, if an X0 connection type is selected during the first iteration of step 720, then X1, X2, and X6 connection types may be selected during the following three iterations as steps 725 to 735 are repeated for all connection types supported by the selected CIB 230. Accordingly, following such iterations, system 120 will have determined a corresponding congestion index value for each type of connection (e.g., four congestion index values in this example for X0, X1, X2, and X6 connections). Also, system 120 will have determined a corresponding overflow connection value for at least a subset of connection types (e.g., two overflow connection values in this example for X0 and X1 connections). It is contemplated that additional overflow connection values may be calculated in other embodiments.

In step 740, if additional CIBs 230 of PLD 100 have not yet been considered, then the process of FIG. 7 returns to step 720 wherein another CIB 230 of PLD 100 is selected for consideration. Accordingly, by repeating steps 720 to 740 for all CIBS 230 of PLD 100, system 120 may determine congestion index values for all types of connections at all CIBS 230 and also determine overflow connection values for at least a subset of connection types.

In step 745, system 120 may use the congestion index values to allocate additional routing resources 118 (e.g., to implement previously signal paths previously identified in step 710) and/or or to identify new signal paths through routing resources 118. For example, system 120 may choose to implement signal paths using CIBs 230 that are relatively not congested (e.g., having low congestion index values connection types to be used for the signal paths). As another example, if a particular CIB 230 has an insufficient number of connections of a particular type (e.g., having an overflow connection value for a particular connection type), system 120 may choose to implement signal paths through the particular CIB 230 using a different connection type.

FIG. 8 illustrates a process to determine a congestion index value for a selected connection type in accordance with an embodiment of the present invention. For example, in one embodiment, the process of FIG. 8 may be performed by system 120 during step 730 of FIG. 7 if X0 or X1 connections are selected during step 725 of FIG. 7.

In step 810, system 120 determines how many connections of the selected connection type are provided by the selected CIB 230, which is also referred to as the routing capacity value (denoted $RC_{X0}$ for X0 connection types and $RC_{X1}$ for X1 connection types).

For example, if an X0 connection type is selected, then step 810 determines the total number of connections 290 that may be supported by the selected CIB 230, which is denoted $RC_{X0}$. If an X1 connection type is selected, then step 810 determines the total number of wires 410 and 420 that may be connected to the selected CIB 230, which is denoted $RC_{X1}$.

In step 815, system 120 determines how many connections of the selected connection type have already been allocated (e.g., allocated to signal paths in previous step 715), which is also referred to as the routing occupied value (denoted $RO_{X0}$ for X0 connection types and $RO_{X1}$ for X1 connection types).

In step 820, system 120 determines how many additional connections of the selected connection type are needed at the selected CIB 230 to provide signal paths (e.g., including signal paths providing input signals to the selected CIB 230 and signal paths providing output signals from the selected CIB 230) that were not previously implemented through allocation of routing resources 118 in previous step 715, which is also referred to as the routing demand value (denoted $RD_{X0}$ for X0 connection types and $RD_{X1}$ for X1 connection types).

In step 825, system 120 determines a total number of connections of the selected connection type that need to be supported by the selected CIB 230. For example, in one embodiment, system 120 may add the number of connections determined in step 820 to the number of connections determined in step 815 to determine the total number of connections in step 825 (e.g., $(RD_{X0}+RO_{X0})$ for X0 connection types and $(RD_{X1}+RO_{X1})$ for X1 connection types).

In step 830, system 120 determines a congestion index value for the selected connection type (denoted $CI_{X0}$ for X0 connection types and $CI_{X1}$ for X1 connection types). As previously discussed, the congestion index value may correspond to a ratio of the number of connections needed at the selected CIB 230 (determined in step 825) to the number of connections provided by the selected CIB 230 (determined in step 810). As also previously discussed, the congestion index value may be limited to a maximum value of one.

In step 835, system 120 determines an overflow connection value for the selected connection type (denoted $EX_{X0}$ for X0 connection types and $EX_{X1}$ for X1 connection types). As previously discussed, the overflow connection value may correspond to the difference between the number of connections needed at the selected CIB 230 (determined in step 825) and the number of connections provided by the selected CIB 230 (determined in step 810).

In one embodiment, congestion index value $CI_{X0}$ and overflow connection value $EX_{X0}$ for X0 connection types at the selected CIB 230 may be determined by system 120 performing processing during steps 830 and 835 in accordance with pseudocode set forth in the following Table 1:

TABLE 1

$CI_{X0} = (RD_{X0} + RO_{X0})/RC_{X0}$
if ($CI_{X0} > 1$)
{
  $CI_{X0} = 1$
  $EX_{X0} = RD_{X0} + RO_{X0} - RC_{X0}$
}

TABLE 1-continued

```
    else
    {
        CI_XO = CI_XO
        EX_XO = 0
    }
```

In one embodiment, congestion index value $CI_{X1}$ and overflow connection value $EX_{X1}$ for X1 connection types at the selected CIB 230 may be determined by substituting values corresponding to X1 connection types into the pseudocode of Table 1.

In other embodiments, if particular directional orientations are used, different congestion index values and overflow values may be determined. For example, if more specific X1 east, X1, west, X1 north, or X1 south connection types are used, corresponding values may be determined for $CI_{X1}$ east and $EX_{X1}$ east, $CI_{X1}$ west and $EX_{X1}$ west, $CI_{X1}$ north and $EX_{X1}$ north, and $CI_{X1}$ south and $EX_{X1}$ south.

FIG. 9 illustrates another process to determine a congestion index value for a selected connection type in accordance with an embodiment of the present invention. For example, in one embodiment, the process of FIG. 9 may be performed by system 120 during step 730 of FIG. 7 if X2 or X6 connections are selected during step 725 of FIG. 7.

In step 910, system 120 determines how many connections of the selected connection type are provided by the selected CIB 230, which is also referred to as the routing capacity value (denoted $RC_{X2}$ for X2 connection types and $RC_{X6}$ for X6 connection types).

For example, if an X2 connection type is selected, then step 910 determines the total number of wires 510 and 520 that may be supported by the selected CIB 230, which is denoted $RC_{X2}$. If an X6 connection type is selected, then step 910 determines the total number of wires 610 that may be connected to the selected CIB 230, which is denoted $RC_{X6}$.

In step 915, system 120 determines how many connections of the selected connection type have already been allocated (e.g., allocated to signal paths in previous step 715), which is also referred to as the routing occupied value (denoted $RO_{X2}$ for X2 connection types and $RO_{X6}$ for X6 connection types).

In steps 920 to 930, system 120 determines how many additional connections of the selected connection type are needed at the selected CIB 230 to provide signal paths that were not previously implemented through allocation of routing resources 118 in previous step 715.

During the process of FIG. 9, system 120 may identify such signals as either input signals received at the selected CIB 230 or output signals sent from the selected CIB 230. System 120 may further identify the output signals as either "short distance" output signals which traverse a distance of two, three, or four grid positions, or "long distance" output signals which traverse a distance greater than four grid positions. For example, in one embodiment, X2 connections (e.g., used alone or chained together with other X2 connections) may be preferably used for efficient resource utilization and minimal delay of short distance output signals, and X6 connections may be preferably used for efficient resource utilization and minimal delay of long distance output signals.

Accordingly, in step 920, system 120 determines how many additional connections of the selected connection type are needed at the selected CIB 230 to provide signal paths for input signals to the selected CIB 230, which is also referred to as the input signal demand value (denoted $S_{inX2}$ for X2 connection types and $S_{inX6}$ for X6 connection types).

Also during step 920, system 120 may adjust the input signal demand value by a coefficient for X2 connection types (denoted $c_{in-X2}$) to account for pin sharing of input connections. For example, in one embodiment, a signal received at the selected CIB 230 may be routed to two or more input connections 270 between switch box 260 and component 240 of FIG. 3 (e.g., the signal may fan out to more than one load provided by component 240). In this case, the two or more input connections 270 may be associated with a shared X2 connection of the selected CIB 230 used for receiving the signal. As a result, the total number of X2 connections needed at the selected CIB 230 may be reduced. The input signal demand value after such adjustment may be denoted $(c_{in-X2})*(S_{inX2})$ for X2 connection types. In one embodiment, coefficient $c_{in-X2}$ may vary based on the particular type of component 240 associated with the selected CIB 230. Coefficient $c_{in-X2}$ may be determined by system 120, for example, based on the amount of X2 connection pin sharing identified in benchmark testing of routings implemented in previous PLD configurations for PLDs having the same or similar architectures as PLD 100.

In step 925, system 120 determines how many additional connections of the selected connection type are needed at the selected CIB 230 to provide signal paths using X2 connections for short distance output signals to the selected CIB 230, which is also referred to as the short distance output signal demand value (denoted $S_{out-sX2}$).

In step 930, system 120 determines how many additional connections of the selected connection type are needed at the selected CIB 230 to provide signal paths for long distance output signals to the selected CIB 230, which is also referred to as the long distance output signal demand value (denoted $S_{out-1X2}$ for X2 connection types and $S_{out-1X6}$ for X6 connection types).

As previously discussed, long distance output signals may be routed using X2 connections or X6 connections. Accordingly, depending on the type of connection selected during the process of FIG. 9, system 120 may adjust the long distance output signal demand value by a coefficient (denoted $c_{out-1X2}$ for X2 connection types and $c_{out-1X6}$ for X6 connection types) during step 930 to allocate the long distance output signals between X2 and X6 connection types. Coefficients $c_{out-1X2}$ and $c_{out-1X6}$ may be determined by system 120, for example, based on the proportional distribution of X2 and X6 connections in benchmark testing of routings implemented in previous PLD configurations for PLDs having the same or similar architectures as PLD 100.

For example, if an X2 connection type is selected during FIG. 9, then the long distance output signal demand value $S_{out-1X2}$ may be adjusted by coefficient $c_{out-1X2}$ (e.g., having a value between zero and one) to reduce the number of X2 connections expected to be used by the long distance output signals in a manner that is proportional to the number of X6 connections expected to be used by the long distance output signals. Similarly, if an X6 connection type is selected during FIG. 9, then the long distance output signal demand value $S_{out-1X6}$ may be adjusted by coefficient $c_{out-1X6}$ (e.g., having a value between zero and one) to reduce the number of X6 connections expected to be used by the long distance output signals in a manner that is proportional to the number of X2 connections expected to be used by the long distance output signals. Accordingly, the long distance output signal demand values after such adjustments may be denoted $(c_{out-1X2})*(S_{out-1X2})$ for X2 connection types and $(c_{out-1X6})*(S_{out-1X6})$ for X6 connection types.

In step 935, system 120 determines how many additional connections of the selected connection type are needed at the selected CIB 230 for signal paths passing through CIB 230 to other components 240 (e.g., components 240 associated with CIBs 230 other than the currently selected CIB 230). For example, referring to FIG. 2, CIBs 230(1), 230(3), and 230(4) may be used to pass signals from component 240(1) to component 240(4). In this regard, wire 220(3) may include two X2 connections: a first X2 connection between CIBs 230(1) and 230(3); and a second X2 connection between CIBs 230 (3) and 230(4). Accordingly, CIB 230(3) may be used in this example for a signal path (i.e., corresponding to wire 220(3)) passing through CIB 230(3) to another component (e.g., component 240(4)) that is not associated with CIB 230(3). X6 connections may be similarly used to provide signal paths for passing signals through CIBs 230 to other components 240.

The number of such connections used for passing signals are referred to herein as passing signal demand values (denoted $Pass_{X2}$ for X2 connection types and $Pass_{X6}$ for X6 connection types). In one embodiment, the passing signal demand values may be determined in accordance with the process of FIG. 10 further described herein.

In step 940, system 120 determines a total number of connections of the selected connection type that need to be supported by the selected CIB 230 in order to implement the routed and unrouted signals. For example, the routing demand value $RD_{X2}$ for X2 connections may be determined by adding the number of connections determined in steps 920, 925, 930, and 935 to the overflow connection values for X0 and X1 connections previously determined in step 835 of FIG. 8. In this regard, X2 connections may be used to support excess (i.e., overflow) X0 and X1 connections if desired in particular embodiments. Accordingly, in one embodiment, the routing demand value $RD_{X2}$ for X2 connections may include overflow X0 and X1 connections.

Thus, for X2 connection types, the routing demand value $RD_{X2}$ may be determined in accordance with the following equation 1:

$$RD_{X2}=S_{inX2}+S_{out-sX2}+(f_{X2})*(S_{out-LX2})+Pass_{X2}+ (c_{overX0})*(EX_{X0})+(c_{overX1})*(EX_{X1}) \quad \text{(equation 1)}$$

In equation 1, coefficients $c_{overX0}$ and $c_{overX1}$ are used to scale the number of overflow connections to be supported by X2 connections and may be determined in benchmark testing of routings implemented in previous PLD configurations for PLDs having the same or similar architectures as PLD 100.

The routing demand value $RD_{X6}$ for X6 connections may be determined by adding the number of connections determined in steps 930 and 935. In this example, X6 connections are not used to support excess X0 and X1 connections, input signals, or short distance output signals. However, such support is contemplated in other embodiments as similarly described herein with regard to X2 connections.

Thus, for X6 connection types, the routing demand value $RD_{X6}$ may be determined in accordance with the following equation 2:

$$RD_{X6}=(f_{X6})*(S_{out-LX6})+Pass_{X6} \quad \text{(equation 2)}$$

After determining the routing demand value for the selected connection type, system 120 adds the routing demand value to the routing occupied value previously determined in step 915 to obtain the total number of connections of the selected connection type that need to be supported by the selected CIB 230. Thus, for X2 connection types, the total number of connections is: $RD_{X2}+RO_{X2}$. For X6 connection types, the total number of connections is: $RD_{X6}+RO_{X6}$.

In step 945, system 120 determines a congestion index value for the selected connection type (denoted $CI_{X2}$ for X2 connection types and $CI_{X6}$ for X6 connection types). The congestion index value may correspond to a ratio of the number of connections needed at the selected CIB 230 (determined in step 940) to the number of connections provided by the selected CIB 230 (determined in step 910).

Accordingly, the congestion index values for X2 connections and X6 connections may be determined in accordance with the following equations 3 and 4:

$$CI_{X2}=(RD_{X2}+RO_{X2})/RC_{X2} \quad \text{(equation 3)}$$

$$CI_{X6}=(RD_{X6}+RO_{X6})/RC_{X6} \quad \text{(equation 4)}$$

In this example, excess X2 and X6 connections are not determined. However, it is contemplated that such excess connections may be determined in other embodiments as similarly described herein with regard to excess X0 and X1 connections and may be allocated to other routing resources 118. For example, it is contemplated that if the selected CIB 230 has insufficient X2 or X6 connections, signal paths previously associated with the selected CIB 230 may be instead routed to other CIBS 230 adjacent to or nearby the selected CIB 230 through appropriate detour signal paths.

In other embodiments, if particular directional orientations are used, different congestion index values and overflow values may be determined. For example, if more specific X2 east, X2, west, X2 north, or X2 south connection types are used, corresponding values may be determined for $CI_{X2}$ east, $CI_{X2}$ west, $CI_{X2}$ north, and $CI_{X2}$ south.

Figure 10:
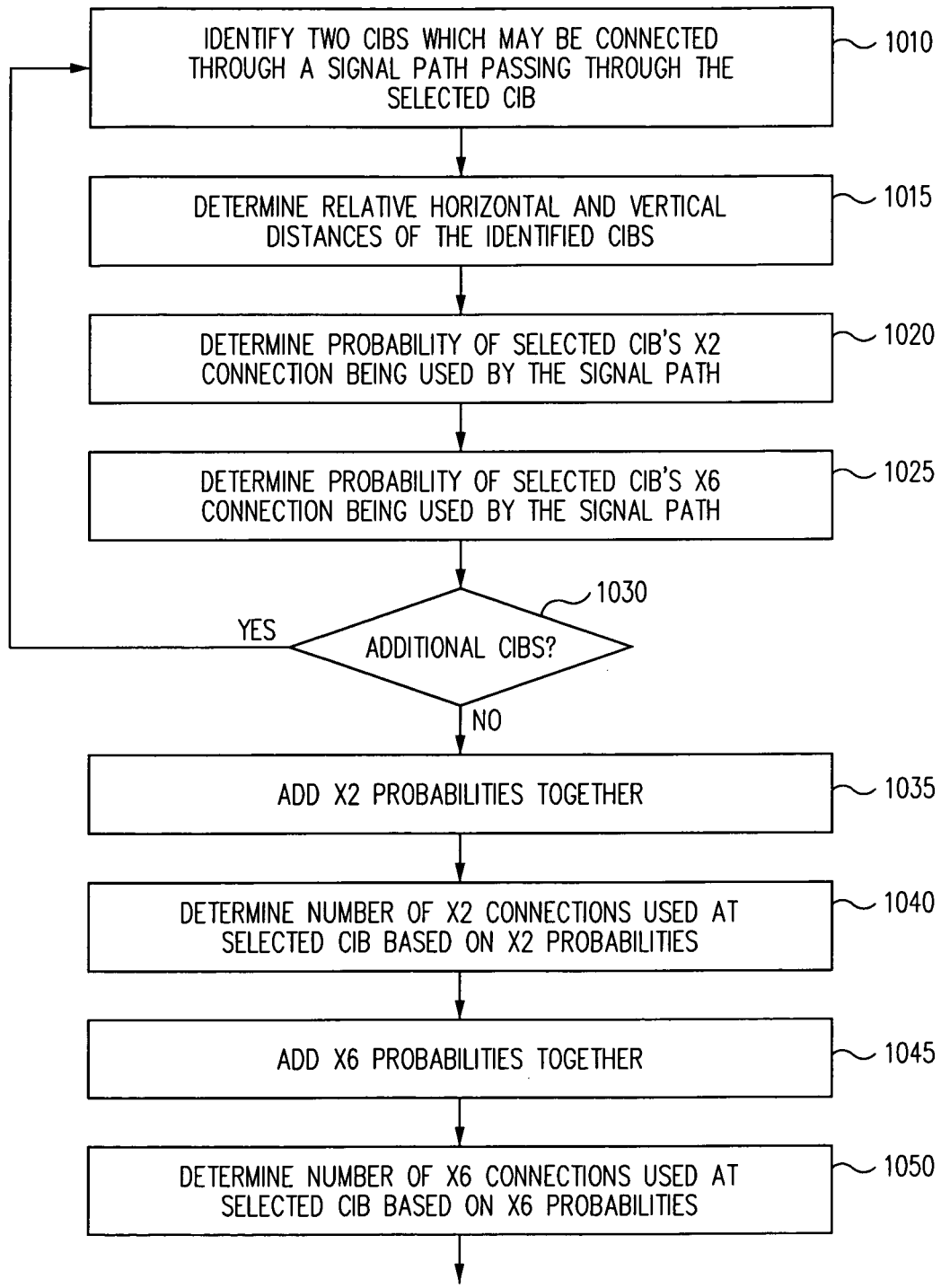
FIG. 10 illustrates a process to determine connections of a common interface block used to pass signals between other common interface blocks in accordance with an embodiment of the present invention.

FIG. 10 illustrates a process to determine probable connections of a CIB 230 of PLD 100 used to pass signals between other CIBS 230 of PLD 100 in accordance with an embodiment of the present invention. For example, in one embodiment, the process of FIG. 10 may be performed by system 120 during step 935 of FIG. 9 to determine passing signal demand values $Pass_{X2}$ and $Pass_{X6}$ of the CIB 230 selected in step 720 of FIG. 7 as previously described herein.

In step 1010, system 120 identifies two CIBS 230 that may be connected by a signal path passing through the CIB 230 selected in step 720 of FIG. 7. In this regard, FIGS. 11A-D illustrate various examples of CIBs 230 of PLD 100 used to pass signals between other identified CIBs 230 of PLD 100 using various connection types in accordance with embodiments of the present invention. Although various X2 and X6 connections are illustrated in FIGS. 11A-D, any desired connection types may be used.

Figure 11A:
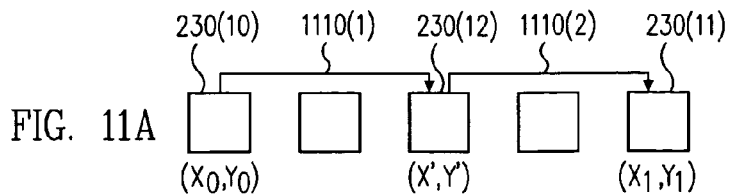
FIGS. 11A-D illustrate common interface blocks used to pass signals between other common interface blocks in accordance with embodiments of the present invention.

FIG. 11A illustrates a selected CIB 230(12) located between other CIBs 230(10) and 230(11). Selected CIB 230 (12) may be used to provide a signal path from CIB 230(10) to CIB 230(11) through X2 connections 1110(1) and 1110(2).

Figure 11B:
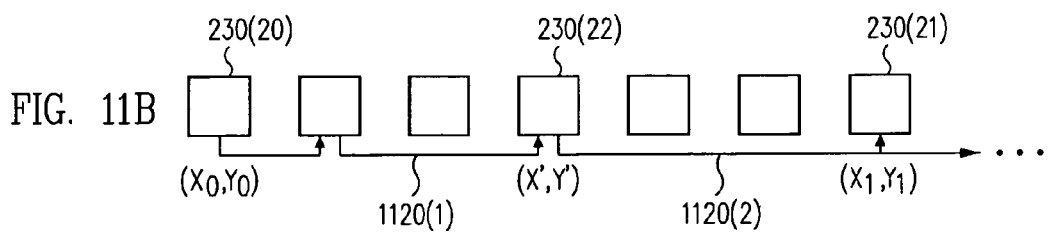

FIG. 11B illustrates a selected CIB 230(22) located between other CIBs 230(20) and 230(21). Selected CIB 230 (22) may be used to provide a signal path from CIB 230(20) to CIB 230(21) through an X2 connection 1120(1) and an X6 connection 1120(2).

Figure 11C:
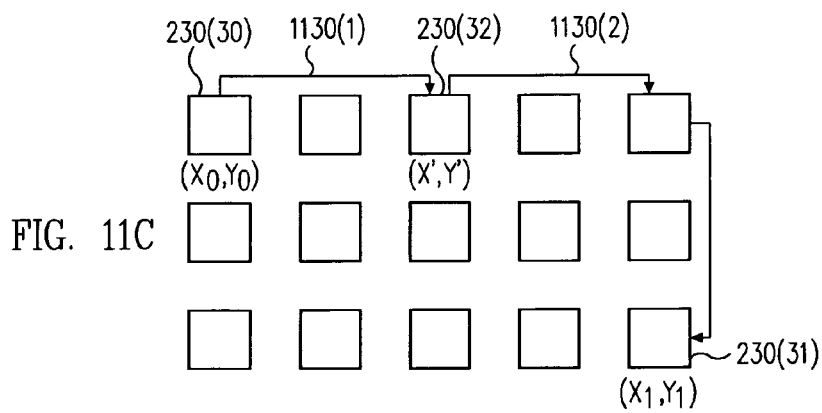

FIG. 11C illustrates a selected CIB 230(32) located between other CIBs 230(30) and 230(31). Selected CIB 230 (32) may be used to provide a signal path from CIB 230(30) to CIB 230(31) through X2 connections 1130(1) and 1130(2).

Figure 11D:
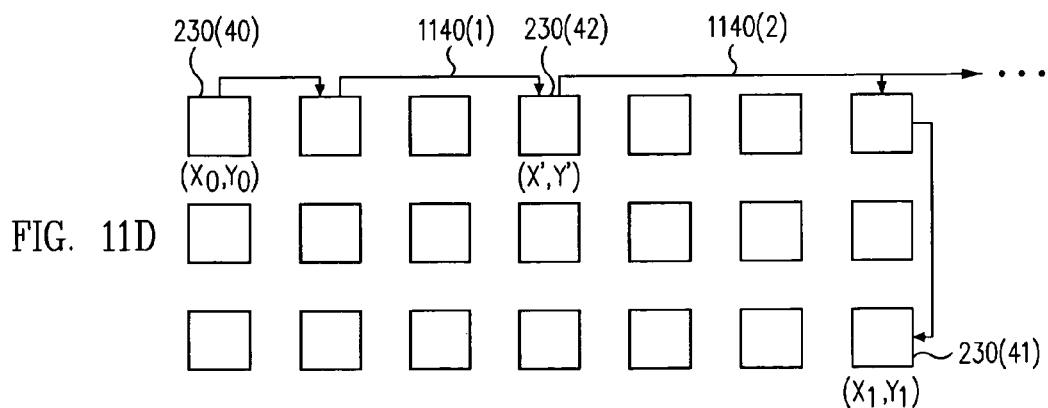

FIG. 11D illustrates a selected CIB 230(42) located between other CIBs 230(40) and 230(41). Selected CIB 230 (42) may be used to provide a signal path from CIB 230(40) to CIB 230(41) through an X2 connection 1140(1) and an X6 connection 1140(2).

Referring again to FIG. 10, in step 1015, system 120 determines the relative horizontal and vertical distances of the CIBs 230 identified in previous step 1010. In one embodiment, such distances may be determined in accordance with numbers of grid positions as similarly described herein with regard to FIGS. 2-6. For example, as illustrated in FIGS. 11A-D, the positions of various CIBs 230 are identified using the coordinates (x0,y0), (x1,y1), and (x',y').

In FIG. 11A, CIBs 230(10) and 230(11) are separated by a horizontal distance of four grid positions (|x1−x0|=4) and a vertical distance of zero grid positions (|y1−y0|=0).

In FIG. 11B, CIBs 230(20) and 230(21) are separated by a horizontal distance of six grid positions (|x1−x0|=6) and a vertical distance of zero grid positions (|y1−y0|=0).

In FIG. 11C, CIBs 230(30) and 230(31) are separated by a horizontal distance of four grid positions (|x1−x0|=4) and a vertical distance of two grid positions (|y1−y0|=2).

In FIG. 11D, CIBs 230(40) and 230(41) are separated by a horizontal distance of six grid positions (|x1−x0|=6) and a vertical distance of two grid positions (|y1−y0|=2).

In step 1020, system 120 determines a probability of an X2 connection of the selected CIB 230 being used to provide a signal path between the other CIBs 230 identified in previous step 1010. Similarly, in step 1025, system 120 determines a probability of an X6 connection of the selected CIB 230 being used to provide a signal path between the other CIBs 230 identified in previous step 1010. In various embodiments, the probabilities determined in steps 1020 and 1025 may depend on the horizontal and vertical distances determined in previous step 1015.

For example, in the case of FIG. 11A, CIBs 230(10) and 230(11) are separated by a horizontal distance of four grid positions and a vertical distance of zero grid positions. As such, the signal path provided from CIB 230(10) to CIB 230(11) may traverse along a row that includes CIB 230(12) as shown in FIG. 11A. In one embodiment, only X2 connections are used to connect CIBs 230 separated by distances less than five grid positions. In this embodiment, the probability $p_{X2}$ of an X2 connection of CIB 230(12) being used to provide the signal path is one (e.g., $p_{X2}$=1), and the probability $p_{X6}$ of an X6 connection of CIB 230(12) being used to provide the signal path is zero (e.g., $p_{X6}$=0).

In the case of FIG. 11B, CIBs 230(20) and 230(21) are separated by a horizontal distance of six grid positions and a vertical distance of zero grid positions. As such, the signal path provided from CIB 230(20) to CIB 230(21) may traverse along a row that includes CIB 230(22) as shown in FIG. 11B. In one embodiment, either X2 connections or X6 connections may be used to connect CIBs 230 separated by distances of five or more grid positions. In this embodiment, the probability $p_{X6}$ of an X6 connection of CIB 230(22) being used to provide the signal path is represented by: λ (e.g., $p_{X6}$=λ), and the probability $p_{X2}$ of an X2 connection of CIB 230(22) being used to provide the signal path is represented by: 1−λ (e.g., $p_{X2}$=1−λ). In this regard, A is a probability (e.g., typically approximately 0.7) based on the proportional distribution of X2 and X6 connections in benchmark testing of routings implemented in previous PLD configurations for PLDs having the same or similar architectures as PLD 100.

In the case of FIG. 11C, CIBs 230(30) and 230(31) are separated by a horizontal distance of four grid positions and a vertical distance of two grid positions. As such, the signal path provided from CIB 230(30) to CIB 230(31) may traverse along horizontal and vertical wires as shown in FIG. 11C. In one embodiment, only X2 connections are used to connect CIBs 230 separated by distances less than five grid positions.

In this embodiment, the probability $p_{X6}$ of an X6 connection of CIB 230(32) being used to provide the signal path is zero, and the probability $p_{X2}$ of an X2 connection of CIB 230(32) being used to provide the signal path is represented by the following equations 5-7, where $p_{X2}=p_{x',y'}$:

$$p_{x',y'} = \frac{x'-x0}{x1-x0}P_H + \frac{1}{y1-y0}P_V, \text{ if } y'=y1 \quad \text{(equation 5)}$$

$$p_{x',y'} = \frac{x1-x'+1}{x1-x0}P_H, \text{ if } y'=y0 \quad \text{(equation 6)}$$

$$p_{x',y'} = \frac{1}{y1-y0}P_V, \text{ if } y' \neq y0 \text{ and } y' \neq y1 \quad \text{(equation 7)}$$

In equations 5-7, $P_H+P_V=1$, wherein $P_H$ is a probability that a horizontal wire connection is used and $P_V$ is a probability that a vertical wire connection is used. In this regard, $P_H$ and $P_V$ may be based on the proportional distribution of horizontal and vertical X2 connections in benchmark testing of routings implemented in previous PLD configurations for PLDs having the same or similar architectures as PLD 100. In one embodiment, for a PLD having equal numbers of horizontal and vertical X2 connections, $P_H=P_V=0.5$.

In the case of FIG. 11D, CIBs 230(40) and 230(41) are separated by a horizontal distance of six grid positions and a vertical distance of two grid positions. As such, the signal path provided from CIB 230(40) to CIB 230(41) may traverse along horizontal and vertical wires as shown in FIG. 11D. In one embodiment, either X2 connections or X6 connections may be used to connect CIBs 230 separated by distances of five or more grid positions.

In this embodiment, the probability $p_{X2}$ of an X2 connection of CIB 230(42) being used to provide the signal path and the probability $p_{X6}$ of an X6 connection of CIB 230(42) being used to provide are represented by the following equations 8 and 9, wherein the values of λ and $p_{x',y'}$ are determined as previously described herein:

$$p_{X2}=(1-\lambda)*p_{x',y'} \quad \text{(equation 8)}$$

$$p_{X6}=\lambda*p_{x',y'} \quad \text{(equation 9)}$$

In step 1030, system 120 determines whether the selected CIB 230 may be used to pass signals through signal paths connecting any other CIBs 230 of PLD 100. In this regard, it will be appreciated that in the previous iteration of steps 1010 to 1025, two other CIBs 230 were considered. Accordingly, system 120 may repeat these steps until all possible CIBs 230 of PLD 100 are considered.

As a result of these iterations of steps 1010 to 1025, system 120 may determine a plurality of probabilities $p_{X2}$ for the selected CIB 230 (e.g., a different probability $p_{X2}$ for each identified pair of other CIBs 230 which may be connected by a signal path passed by the selected CIB 230). Similarly, system 120 may determine a plurality of probabilities $p_{X6}$ for the selected CIB 230.

Accordingly, system 120 adds the probabilities $p_{X2}$ together (step 1035) and uses the sum to determine the passing signal demand value $Pass_{X2}$ for the selected CIB 230 (step 1040). Also, system 120 adds the probabilities $p_{X6}$ together (step 1045) and uses the sum to determine the passing signal demand value $Pass_{X6}$ for the selected CIB 230 (step 1050). For example, in one embodiment, system 120 may adjust the sums of the probabilities $p_{X2}$ and $p_{X6}$ by one or more coefficients (e.g., based on benchmark testing of routings implemented in previous PLD configurations for PLDs having the same or similar architectures as PLD 100) to determine the passing signal demand values $Pass_{X2}$ and $Pass_{X6}$.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A computer readable storage medium storing computer readable instructions that when executed perform a method of estimating signal congestion in routing resources of a programmable logic device (PLD), wherein the routing resources comprise common interface blocks (CIBs) and wires of different types supported by the CIBs, the method comprising:

identifying, from a representation of a PLD stored within a computer system, components of the PLD to be connected in a configuration of the PLD;
selecting, within the computer system, a CIB associated with an identified PLD component;
selecting, within the computer system, a wire type supported by the selected CIB;
determining, within the computer system, a number of wires of the selected wire type needed at the selected CIB to implement the PLD configuration, a number of wires of the selected wire type already allocated at the CIB, and a provided number of wires of the selected wire type provided by the CIB; and
determining, within the computer system, a congestion index at the selected CIB for the selected wire type from at least the needed number of wires, the number of wires already allocated, and the provided number of wires.

2. The computer readable storage medium of claim 1, wherein the PLD components are arranged in a grid, and the wires of different types includes wires having lengths of at least zero, one, and two grid positions within the PLD.

3. The computer readable storage medium of claim 1, wherein the different types of wires includes wires of different lengths internal and external to the CIB.

4. The computer readable storage medium of claim 1, wherein determining a congestion index comprises calculating a congestion index value for the selected CIB by comparing the needed number of wires to the provided number of wires.

5. The computer readable storage medium of claim 1, wherein the selected wire type is a first type.

6. The computer readable storage medium of claim 1, wherein the selected CIB is a first CIB.

7. The computer readable storage medium of claim 1, wherein the selected wire type is a first wire type, the method further comprising:
calculating, within the computer system, a number of overflow connections associated with the selected CIB for the first wire type corresponding to a difference between a number of connections of the first wire type needed at the selected CIB to implement the PLD configuration and a number of connections of the first wire type provided by the selected CIB; and
substituting, within the computer system, a second wire type for the first wire type to support the number of overflow connections.

8. The computer readable storage medium of claim 1, wherein the number of connections of the selected wire type needed at the selected CIB includes connections of the selected wire type to support:
the signal paths that connect to one of the PLD components associated with the selected CIB; and
the signal paths that pass signals through the selected CIB to other PLD components associated with other CIBs.

9. A computer-implemented method of estimating signal congestion in routing resources of a programmable logic device (PLD), wherein the routing resources comprise common interface blocks (CIBs) and wires of different types supported by the CIBs, the method comprising:

identifying, from a representation of a PLD stored within a computer system, components of the PLD to be connected in a configuration of the PLD;
selecting, within the computer system, a CIB associated with an identified PLD component;
selecting, within the computer system, a wire type supported by the selected CIB;
determining, within the computer system, a number of wires of the selected wire type needed at the selected CIB to implement the PLD configuration, a number of wires of the selected wire type already allocated at the CIB, and a provided number of wires of the selected wire type provided by the CIB; and
determining, within the computer system, a congestion index at the selected CIB for the selected wire type from at least the needed number of wires, the already allocated number of wires, and the provided number of wires.

10. The method of claim 9, wherein the PLD components are arranged in a grid, and the wires of different types includes wires having lengths of at least zero, one, and two grid positions within the PLD.

11. The method of claim 9, wherein the different types of wires includes wires of different lengths internal and external to the CIB.

12. The method of claim 9, wherein determining a congestion index comprises calculating a congestion index value for the selected CIB by comparing the needed number of wires to the provided number of wires.

13. The method of claim 9, wherein the selected wire type is a first type.

14. The method of claim 9, wherein the selected CIB is a first CIB.

15. A system comprising:
one or more processors; and
one or more memories storing a plurality of computer readable instructions that, when executed by the one or more processors, cause the system to estimate signal congestion in routing resources of a programmable logic device (PLD), wherein the routing resources comprise common interface blocks (CIBs) and a wires of different types supported by the CIBs, the system performing the following:
identifying, from a representation of a PLD stored, components of the PLD to be connected in a configuration of the PLD;
selecting a CIB associated with an identified PLD component;
selecting a wire type supported by the selected CIB;
determining a number of wires of the selected wire type needed at the selected CIB to implement the PLD configuration, a number of wires of the selected wire type already allocated at the CIB, and a provided number of wires of the selected wire type provided by the CIB; and
determining a congestion index at the selected CIB for the selected wire type from at least the needed number of wires, the already allocated number of wires, and the provided number of wires.

16. The system of claim 15, wherein the PLD components are arranged in a grid, and the wires of different types includes wires having lengths of at least zero, one, and two grid positions within the PLD.

17. The system of claim 15, wherein the different types of wires includes wires of different lengths internal and external to the CIB.

18. The system of claim 15, wherein determining a congestion index comprises calculating a congestion index value for the selected CIB by comparing the needed number of wires to the provided number of wires.

19. The system of claim 15, wherein the selected wire type is a first type.

20. The system of claim 15, wherein the selected CIB is a first CIB.

* * * * *